United States Patent [19]

Nemirovsky

[11] Patent Number: 5,444,649

[45] Date of Patent: Aug. 22, 1995

[54] ASSOCIATIVE MEMORY SYSTEM HAVING CONFIGURABLE MEANS FOR COMPARING FIELDS IN AN ARRAY OF STORED DATA WORDS WITH CORRESPONDING ONE OR MORE FIELDS IN A SUPPLIED ARGUMENT WORD

[75] Inventor: Mario D. Nemirovsky, San Jose, Calif.

[73] Assignee: Apple Computer, Inc., San Jose, Calif.

[21] Appl. No.: 74,794

[22] Filed: Jun. 10, 1993

[51] Int. Cl.$^6$ ............................................. G11C 15/00
[52] U.S. Cl. .................................. 365/49; 365/189.07; 365/189.08
[58] Field of Search ................ 365/49, 189.05, 189.07, 365/189.08

[56] References Cited

U.S. PATENT DOCUMENTS

| | | | |
|---|---|---|---|
| 4,723,224 | 2/1988 | Van Hulett et al. | 365/49 |
| 4,890,260 | 12/1989 | Chuang et al. | 365/49 |
| 4,996,666 | 2/1991 | Duluk, Jr. | 365/49 |
| 5,018,099 | 5/1991 | Burrows | 365/49 |
| 5,072,422 | 12/1991 | Rachels | 365/49 |
| 5,257,220 | 10/1993 | Shin et al. | 365/49 |

OTHER PUBLICATIONS

Caxton C. Foster, *Content Addressable Parallel Processors*, Computer Science Series, Van Nostrand Reinhold Company, pp. 56–103, 1976.

Baer, "Associative Memory", *Computer Systems Architecture*, 1980 Computer Science Press, Section. 5.5, pp. 262–266.

Gauss, "Locating the Largest Word in a File Using a Modified Memory", *Journal of the Association for Computing Machinery*, 1961 Association for Computing Machinery, vol. 8, No. 3, pp. 418–425.

Hanlon, "Content-Addressable and Associative Memory Systems", A Survey, *IEEE Transactions on Electronic Computers*, 1966, vol. EC-15, pp. 509–521, No. 4.

Lewin, "Retrival of Ordered Lists from a Content-Addressed Memory", *Radio and Electronics Research Engineering*, 1962 RCA Review, pp. 215–229.

Parhami, "Associative Memories and Processors: An Overview and Selected Bibliography", *Proceedings of the IEEE*, 1973 The Institute of Electrical and Electronics Engineers, pp. 722–730, vol. 61, No. 6.

Seeber, et al., "Associative Memory with Ordered Retrieval", *IBM Journal of Research and Development*, 1962, vol. 6, No. 1, pp. 126–136.

Wolinsky, "Unified Interval Classification and Unified 3–Classification for Associative Memories", *IEEE Transactions on Computers*, 1969, vol. C-18, No. 10, pp. 899–911.

*Primary Examiner*—Joseph A. Popek
*Assistant Examiner*—Andrew Q. Tran
*Attorney, Agent, or Firm*—Fliesler, Dubb, Meyer & Lovejoy

[57] ABSTRACT

An associative memory is configurable to detect one of a plurality of relationships among a set of data, all within a number of cycles equal to the number of bits in the field of data upon which the sort is being executed. Because the memory is configurable, a single memory array can be used to accomplish a wide variety of results, either changing the relationship upon which the data is sorted on the fly, or providing a field programmable or mask programmable configuration input to adapt a given array design to a particular need. The array can be configured according to a configuration input to detect a relationship among fields of data stored in the memory selected from the group including "greater than", "greater than or equal to", "less than", "less than or equal to", "equal to", a minimum and a maximum. Further, the memory system can be adapted to detect the minimum of a first field in a given row and the maximum of a second field in a given row in parallel.

22 Claims, 9 Drawing Sheets

| CONFIG | M1 INIT | M2 INIT | select 1 | stick 1 | en1 | select 2 | stick 2 | en2 | output |
|---|---|---|---|---|---|---|---|---|---|
| B ≥ A | 1 | 0 | 1 | 0 | out1 | 1 | 1 | out1 | out1+out2 |
| B > A | 1 | 0 | 1 | 0 | out1 | 1 | 1 | out1 | out2 |
| B ≤ A | 0 | 1 | 0 | 1 | out2 | 0 | 0 | out2 | out1+out2 |
| B < A | 0 | 1 | 0 | 1 | out2 | 0 | 0 | out2 | out1 |
| B = A | 1 | 1 | 1 | 0 | out1 | 0 | 0 | out2 | out1, out2 |
| MINA | X | 1 # | X | X | X | 0 | 0 | out2*Z2 | out2 |
| MAXA | 1 ## | X | 1 | 0 | out1*Z1 | X | X | X | out1 |

\# ARG = 0....0

\#\# ARG = 1....1

FIG.8

| 1 0 1 0 | M1 INIT | CYCLE | 1 | 2 | 3 | 4 | B≥A |
|---|---|---|---|---|---|---|---|
| 1 1 0 0 | 1 | SELECT 1 | 1 | 0 | 0$^D$ | 0$^D$ | M1+M2 = 0 |
| 1 0 1 0 | 1 | B≥A | 1 | 1 | 1 | 1 | M1+M2 = 1 |
| 1 0 0 1 | 1 | | 1 | 1 | 1 | 0 | M1+M2 = 1 |
| | M2 INIT | | | | | | B>A |
| | 0 | SELECT 2 | 0 | 0 | 0$^D$ | 0$^D$ | M2 = 0 |
| | 0 | B>A | 0 | 0 | 0 | 0 | M2 = 0 |
| | 0 | | 0 | 0 | 1 | 1$^S$ | M2 = 1 |

FIG.8A

| 1 0 1 0 | M1 INIT | CYCLE | 1 | 2 | 3 | 4 | B<A |
|---|---|---|---|---|---|---|---|
| 1 1 0 0 | 0 | SELECT | 0 | 1 | 1$^S$ | 1$^{SD}$ | M1 = 1 |
| 1 0 1 0 | 0 | B<A | 0 | 0 | 0 | 0 | M1 = 0 |
| 1 0 0 1 | 0 | | 0 | 0 | 0 | 0$^D$ | M1 = 0 |
| | M2 INIT | | | | | | B≤A |
| | 1 | SELECT | 1 | 1 | 0 | 0$^D$ | M1+M2 = 1 |
| | 1 | B≤A | 1 | 1 | 1 | 1 | M1+M2 = 1 |
| | 1 | | 1 | 1 | 0 | 0$^D$ | M1+M2 = 0 |

FIG.8B

| | M1 INIT | CYCLE | 1 | 2 | 3 | 4 | B=A |
|---|---|---|---|---|---|---|---|
| 1 0 1 0 | | | | | | | |
| 1 1 0 0 | 1 | SELECT | 1 | 0 | 0$^D$ | 0$^D$ | M1*M2 = 0 |
| 1 0 1 0 | 1 | B≥A | 1 | 1 | 1 | 1 | M1*M2 = 1 |
| 1 0 0 1 | 1 | | 1 | 1 | 1 | 0 | M1*M2 = 0 |
| | M2 INIT | | | | | | |
| | 1 | SELECT | 1 | 1 | 0 | 0$^D$ | |
| | 1 | B≤A | 1 | 1 | 1 | 1 | |
| | 1 | | 1 | 1 | 0 | 0$^D$ | |

FIG.8C

| | M1 INIT | CYCLE | 1 | 2 | 3 | 4 | MAX A |
|---|---|---|---|---|---|---|---|
| 0 0 0 0 | | | | | | | |
| 1 1 0 0 | 1 | SELECT | 1 | 1 | 1$^{ZD}$ | 1$^{ZD}$ | M1 = 1 |
| 1 0 1 0 | 1 | B<A | 1 | 0 | 0$^D$ | 0$^D$ | M1 = 0 |
| 1 0 0 1 | 1 | | 1 | 0 | 0$^D$ | 0$^D$ | M1 = 0 |
| | M2 INIT | | | | | | |
| 1 1 1 1 | | | | | | | MIN A |
| 1 1 0 0 | 1 | SELECT | 1$^{ZD}$ | 0 | 0$^D$ | 0$^D$ | M2 = 0 |
| 1 0 1 0 | 1 | B>A | 1$^{ZD}$ | 1 | 0 | 0$^D$ | M2 = 0 |
| 1 0 0 1 | 1 | | 1$^{ZD}$ | 1 | 1 | 1$^{ZD}$ | M2 = 1 |

FIG.8D

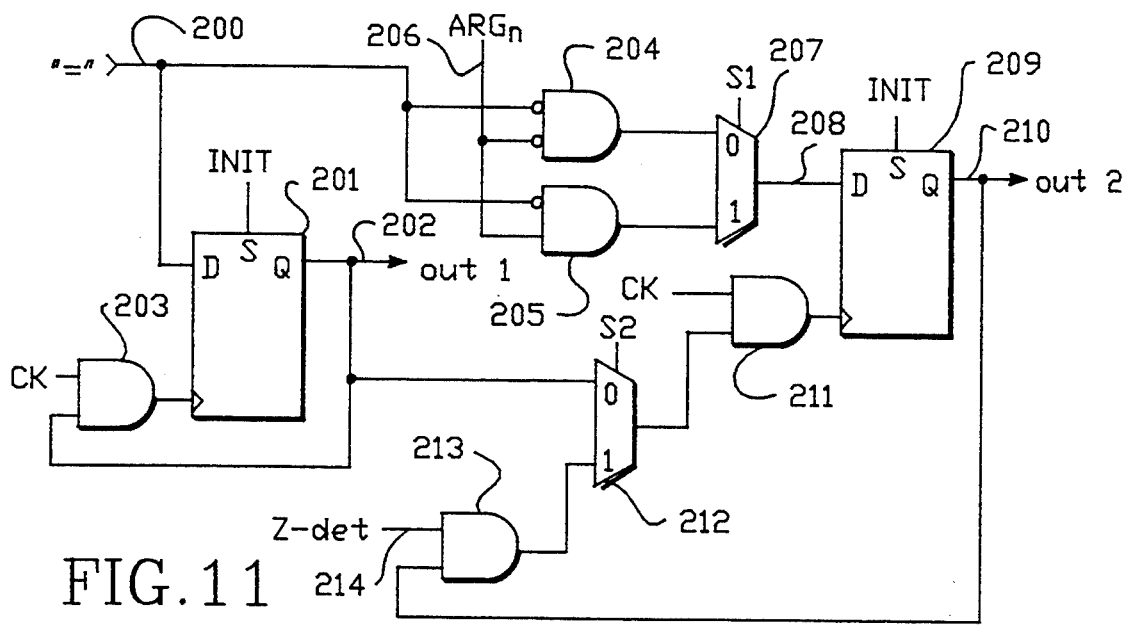
FIG. 11
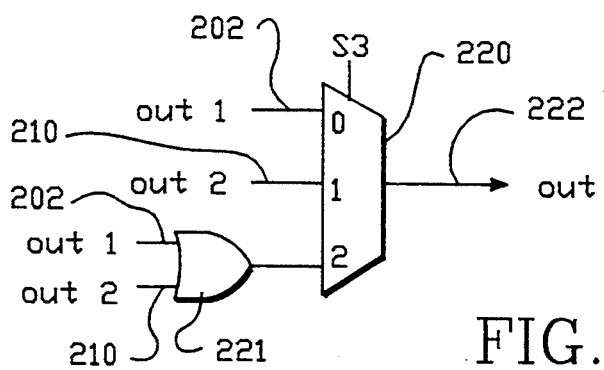
FIG. 12
| CONFIG | OUT 1 INIT | OUT 2 INIT | S1 | S2 | S3 |
|---|---|---|---|---|---|
| B < A | 1 | X | 0 | 0 | 1 |
| B ≤ A | 1 | X | 0 | 0 | 2 |
| B > A | 1 | X | 1 | 0 | 1 |
| B ≥ A | 1 | X | 1 | 0 | 2 |
| B = A | 1 | X(0) | X | X(1) | 0(2) |
| MIN A* | X | 1 | 1 | 1 | 1 |
| MAX A** | X | 1 | 0 | 1 | 1 |
\* ARG = 1
\*\* ARG = 0
FIG. 13

5,444,649

ASSOCIATIVE MEMORY SYSTEM HAVING CONFIGURABLE MEANS FOR COMPARING FIELDS IN AN ARRAY OF STORED DATA WORDS WITH CORRESPONDING ONE OR MORE FIELDS IN A SUPPLIED ARGUMENT WORD

BACKGROUND OF THE INVENTION

1. Field of the Invention

The present invention relates to associative or content-addressable memory systems, and particularly to such systems for sorting data according to a plurality of relationships.

2. Description of the Related Art

Associative or content-addressable memories provide the ability to address items in the memory by the data stored in particular locations, rather than, or in addition to, by the addresses of the locations. This technology has developed based primarily on circuitry within the memory array that detects a match between a field of data stored in each location and an argument supplied as an input. In order to perform operations based on relations other than equality, such as greater than, less than, greater than or equal to, and less than or equal to, a time consuming sequence of masking and testing operations must be computed. See, for instance, Baer, *COMPUTER SYSTEMS ARCHITECTURE*, Section 5.5, "Associative Memory", Computer Science Press, 1980, pp 262–266; and Parhami, "Associative Memories and Processors: an Overview and Selected Bibliography", PROCEEDINGS OF THE IEEE, Vol. 61, No. 6, June 1973, pp. 722–730.

A need for high speed sorting arises in modern graphics algorithms which involve manipulating very large amounts of data for high resolution video screens, and a large number of images which overlay one another on the screen. Thus, a need to quickly sort video data to be displayed on the screen in a real time graphics application creates a need for a mechanism to sort large amounts of data quickly.

Further, the need arises to sort a given set of data according to a variety of relationships.

Accordingly, it is desirable to provide a memory system which allows for very fast sorting of data according to one or more selectable relationships.

SUMMARY OF THE INVENTION

The present invention provides an associative memory which is configurable to detect one of a plurality of relationships among a set of data, all within a number of cycles equal to the number of bits in the field of data upon which the sort is being executed. Because the memory is configurable, a single memory array can be used to accomplish a wide variety of results, either changing the relationship upon which the data is sorted on the fly, or providing a field programmable or mask programmable configuration input to adapt a given array design to a particular need. Thus, the array according to the present invention can be configured according to a configuration input to detect a relationship among fields of data stored in the memory selected from the group including "greater than", "greater than or equal to", "less than", "less than or equal to", "equal to", a minimum and a maximum. Further, the memory system can be adapted to detect the minimum of a first field in a given row and the maximum of a second field in the same row in parallel.

Thus, the present invention can be characterized as an apparatus for sorting data which includes an argument input to receive argument data including N argument bits. A memory including a plurality of rows of storage elements to store respective multibit strings of data including at least one N data bit field which corresponds to the N argument bits stores a set of data to be sorted. Mask logic responsive to control inputs, indicates a selected argument bit from the argument data and a selected data bit from the N data bit field, one at a time in sequence. A plurality of logic circuits are coupled with the corresponding plurality of rows of storage elements. Logic circuits in the plurality are coupled with the mask logic and the argument input and detect a relationship indicating equality or not, between the selected argument bit and the selected data bit indicated by the mask logic in sequence. Alternatively, first and second relationships, effectively "greater than" and "greater than or equal to", the complements of which establish "less than" and "less than or equal to", may be detected. A control circuit having a configuration input which indicates a particular relationship between the N data bit field and the N argument bits is coupled to the plurality of logic circuits and the mask logic. The control circuit supplies the control input to the mask logic to select in sequential cycles the N argument and data bits, and generates either an output indicating equality or not between the argument bit and the data bit, or an output response in response to the first and second relationships indicating a set of rows in the plurality of rows storing at least one N data bit field satisfying the particular relationship indicated by the configuration input.

As mentioned above, the control circuit is configurable in response to the configuration input to detect any one of a plurality of relationships, including "greater than" the argument data, "greater than or equal" to the argument data, "less than" the argument data, "less than or equal to" the argument data, and "equal to" the argument data. The control circuit is also configurable in response to the configuration input to detect a maximum of the stored N data bit fields in the plurality of rows, and a minimum of the stored N data bit fields in the plurality of rows.

Further, an output circuit is coupled to the control circuit which outputs a multibit string of data from a particular row in the set of rows identified by the output response. This output circuit may supply particular rows from the set of row in an order, or otherwise select rows in response to polling or other priority logic as known in the art.

According to one aspect of the invention, the logic circuits in the plurality of logic circuits which are coupled to the corresponding rows of storage elements include respective pluralities of logic cells. Each logic cell in the plurality of logic cells for a particular logic circuit comprises logic having inputs coupled to a corresponding storage element, to the mask logic and to receive a corresponding bit of the N argument bits. The logic generates either an output indicating equality or not between the argument bit and the data bit, or a first output indicating whether the argument bit is "greater than or equal to" the data bit from the storage element, and a second output indicating whether the argument bit is "greater than" the data bit. These outputs are supplied to the control circuit and used in generation of the response output according to the configuration input.

The invention can also be characterized as an apparatus for storing data based on a memory which includes a plurality of associative storage elements. The associative storage elements include a memory cell for a data bit in the N data bit field and a logic cell as above.

Accordingly, an associative memory design which is configurable is provided, that sorts a set of data which includes an N bit data field according to that N bit data field within N cycles, independent of the number of entries in the set. Thus, for example, a memory set including 1000 entries of 16 bit data fields can be sorted according to the value of the 16 bit data field in 16 cycles. If the data in a particular row of the memory is going to be sorted in response to an 8 bit field, then the sort is accomplished in 8 bits independent of the number of rows of storage elements in the memory. Furthermore, according to the present invention, two 8 bit fields can be sorted to determine the minimum in the first field and the maximum in the second field in a single 8 cycle operation. Finally, the particular relationship detected in a given operation using the memory can be changed on the fly in response to a configuration input, or otherwise programmed by the user.

Other aspects and advantages of the present invention can be seen upon review of the figures, the detailed description, and the claims which follow.

BRIEF DESCRIPTION OF THE FIGURES

FIG. 8 is a table illustrating the settings for the configuration inputs for a given relationship.

FIG. 8A is a table illustrating operation of the associative memory for calculation of the relationships: argument B "greater than or equal to" data field A and argument B "greater than" data field A.

FIG. 8B is a table illustrating operation of the associative memory for calculation of the relationships: argument B "less than" data field A, and argument B "less than or equal to" data field A.

FIG. 8C in the table illustrating operation of the associative memory for calculation of the relationships: argument B "equal to" data field A.

FIG. 8D in the table illustrating operation of the associative memory for calculation of the relationships: maximum of data fields A and minimum of data fields A.

FIG. 11 illustrates a control circuit for an alternative embodiment of the present invention.

FIG. 12 illustrates a response output selector for the embodiment of FIG. 11.

FIG. 13 is a table illustrating settings of the configuration inputs for the embodiment of FIGS. 11 and 12.

DESCRIPTION OF THE PREFERRED EMBODIMENTS

Figure 1:
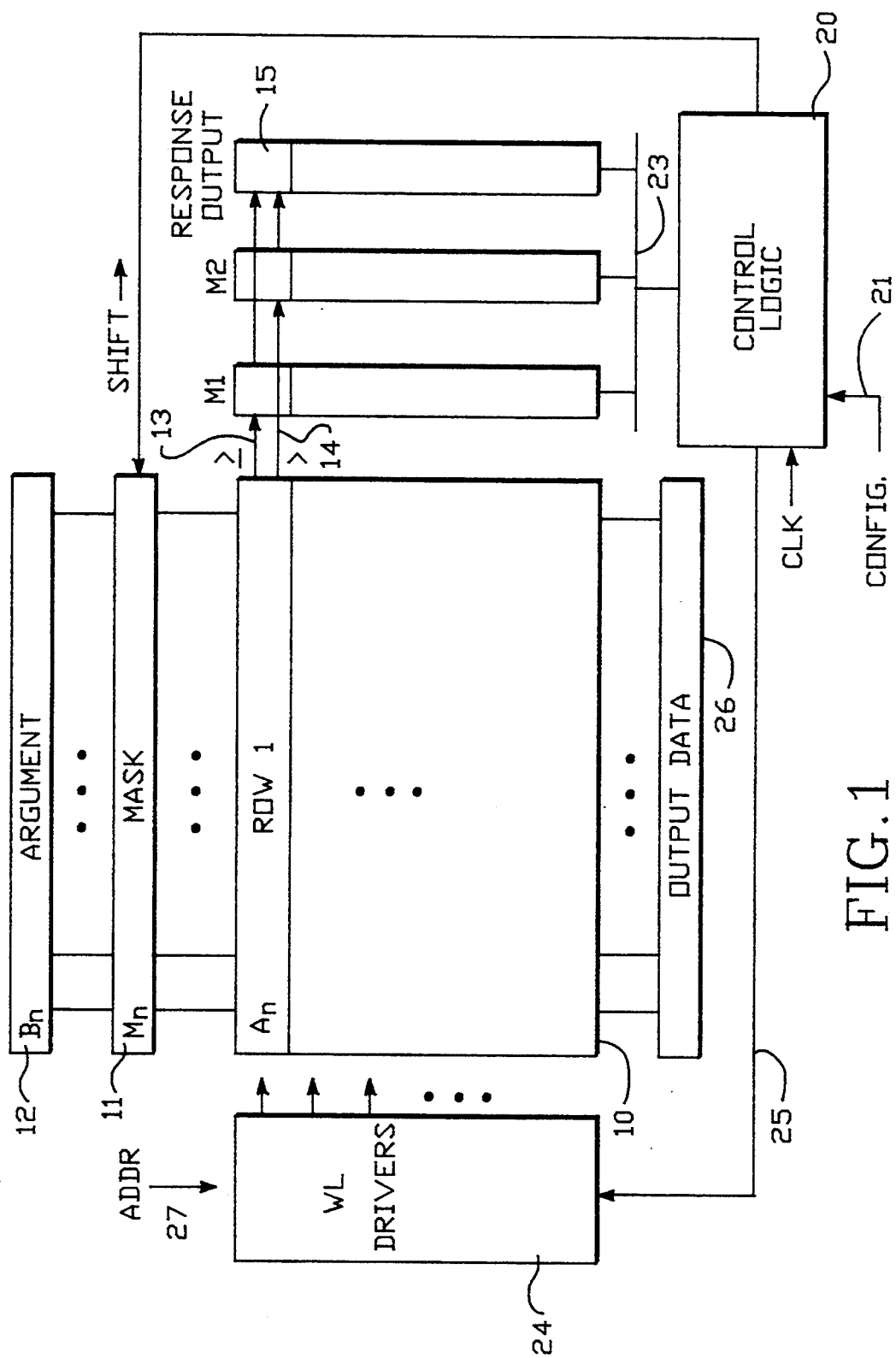
FIG. 1 is a schematic block diagram of an associative memory system according to the present invention.

A detailed description of preferred embodiments of the present invention is provided with respect to the figures. FIG. 1 illustrates the overall memory system for sorting data according to the present invention. FIGS. 2-9 describe the logic circuits and functions involved in the system of FIG. 1. FIG. 10 illustrates an alternative implementation of an associative sorting memory according to the present invention. FIGS. 11-13 illustrate yet another embodiment of the present invention.

FIG. 1 illustrates an associative memory system which is configurable to detect a plurality of relationships among data stored in the memory. The system includes an associative memory array, generally 10, which includes a plurality of rows of associative storage elements, such as row 1. Each storage element in row 1 stores a data bit designated $A_n$ in FIG. 1.

Coupled with the array 10 is a mask register 11 and an argument register 12. The mask register 11 and argument register 12 supply respective mask data $M_n$ and argument data $B_n$ to the rows of associative storage elements in the array 10 in the manner described with respect to FIG. 2.

In addition, a logic cell is associated with each memory cell in the associative storage element which detects a first relationship between the data bit $A_n$ and the argument bit $B_n$ and a second relationship between the data bit $A_n$ and the argument bit $B_n$.

The first relationship in FIG. 1 is signalled on line 13 and indicates whether the argument bit $B_n$ is "greater than or equal to" the data bit $A_n$ for an unmasked cell, and the second relationship is signalled on line 14 which indicates whether the argument bit $B_n$ is "greater than" the data bit $A_n$ for an unmasked cell. Similar outputs are generated for each row in parallel in the array 10, although they are not illustrated in the figure to simplify the drawing.

The outputs on lines 13 and 14 are supplied respectively to output cell M1 and output cell M2. The outputs of cells M1 and M2 are supplied to a response output circuit 15 which supplies a response indicated by user configuration. Coupled with the outputs M1 and M2 and the response output 15 is a control logic circuit 20. The control logic circuit receives a configuration input on line 21 and communicates with the output cells M1 and M2 and the response output 15 across lines 23 to select the relationship indicated by the response output 15 in response to the configuration input 21.

In addition, the control logic 20 controls the mask register 11 to select one bit for each field of data in the respective rows in the array 10 for each access cycle.

Finally, the control logic 20 includes access control circuitry which signals the word line driver 24 across line 25 to indicate a selected row in the array 10 for output. The selected row is then supplied to output data register 26.

The word line drivers 24 are also responsive to addresses on line 27 for read and write accesses to the array 10 as known in the art.

Using the outputs on lines 13 and 14 for each bit in the data stored in the rows of the array 10 in sequence, the circuit is configurable to indicate whether a field of data in the corresponding row is any one of a "greater than", "greater than or equal to", "less than", "less than or equal to", or "equal to" the corresponding field in the argument register 12. In addition, the circuit is configurable to detect a maximum of such field of data for all the rows in the array 10, and a minimum of such field of data for all the rows in the array 10, in one cycle per bit in the field being sorted.

The configuration input 21 can take on a variety of characteristics. For instance, the configuration input may be a random access register that allows the user of the system to configure the response output 15 on the fly, for each sorting operation.

Alternatively, the configuration input 21 may be generated by a field programmable memory, such as fuses, EPROM cells, or the like. Finally, the configuration input 21 may be a mask programmable input, which is specified upon manufacture of the device, but allowing a single array design to be configured for a wide variety of applications.

Figure 2:
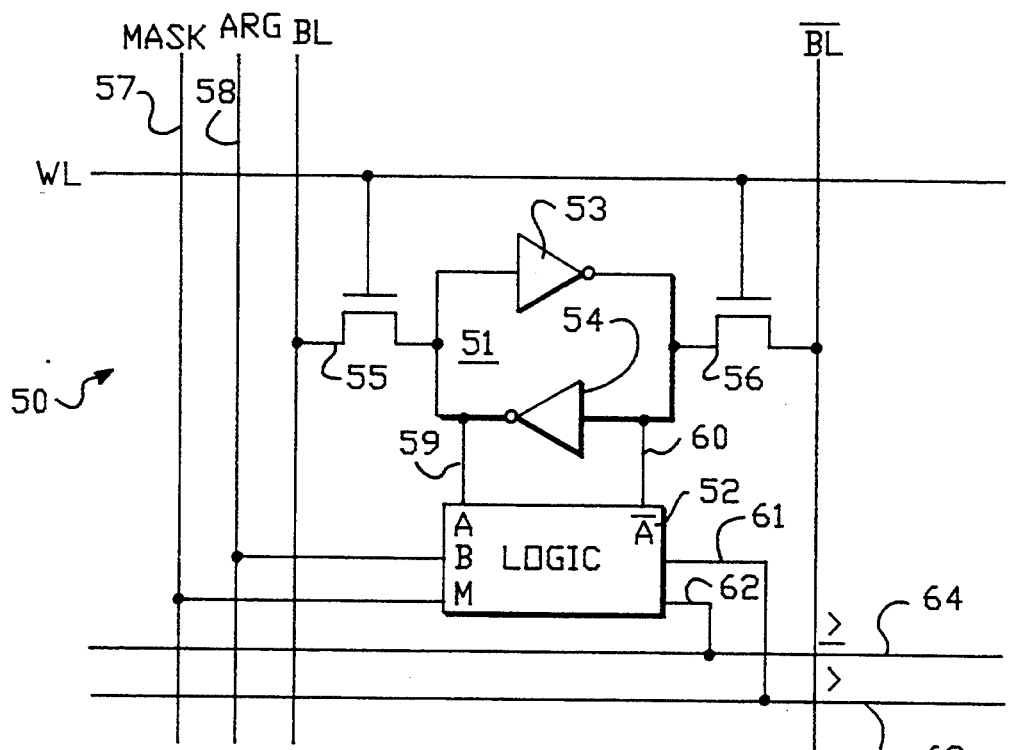
FIG. 2 is a schematic diagram of an associative storage element, including a memory cell and a logic cell for use in the memory of FIG. 1.
Figure 3:
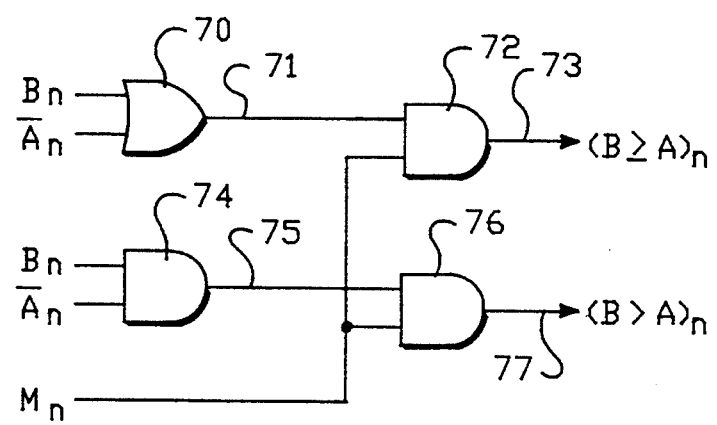
FIG. 3 is a logic diagram of a logic cell for the associative storage element of FIG. 2.

FIGS. 2 and 3 illustrate the structure of the associative storage elements used in the array 10 of FIG. 1 according to a preferred embodiment. In FIG. 2, the memory cell is emphasized. In FIG. 3, the logic cell design is illustrated.

FIG. 2 illustrates the associative storage element, generally 50, for each bit in the array 10. The associative storage element includes a memory cell, generally 51, and a logic cell 52. The memory cell in the preferred embodiment is a standard SRAM design with opposing inverters 53 and 54 coupled to bit lines BL and $\overline{BL}$ on each side of the cell 51. A pass transistor 55 couples a true value A of the cell 51 to bit line BL and pass transistor 56 couples a complement value $\overline{A}$ of the cell 51 to bit line $\overline{BL}$. A word line WL is coupled to the gates of pass transistors 55 and 56. When energized by the word line, the pass transistors connect the data value stored in the cell 51 to the bit lines BL and $\overline{BL}$. These bit lines are then coupled to sense amplifiers and write circuitry, as known in the art, for reading and writing into the cell.

Running along the columns of the array in addition are a mask line 57 and an argument line 58. The mask line 57 carries mask bit $M_n$ for a given column of elements 50, and the argument line 58 carries the argument bit $B_n$ for a given column of elements 50.

The associative storage element 50 also includes a logic cell 52. The inputs to the logic cell include the true and complement outputs of the memory cell 51, designated A and $\overline{A}$, across lines 59 and 60, respectively. In addition, the argument bit $B_n$ is coupled across line 58 to the cell 52, and the mask bit $M_n$ is coupled across line 57 to the cell 52.

The cell 52 generates a first output on line 61 and a second output on line 62. The first output on line 61 indicates whether the argument bit $B_n$ is "greater than" the data bit $A_n$ when the cell is selected by the mask bit $M_n$. This output is coupled to line 63 which extends along a row of cells in the array 10. Line 63 extends along the row of the array to sensing circuitry and an output corresponding to output 14 of FIG. 1.

The second output 62 indicates whether the argument bit $B_n$ is "greater than or equal to" the data bit $A_n$, when the cell is selected by the mask bit $M_n$. This output 62 is coupled to line 64 which proceeds along a row of cells in the array to sensing circuitry and an output corresponding to output 13 of FIG. 1.

FIG. 3 illustrates the structure of the logic cell according to one embodiment of the invention. The logic cell includes OR gate 70 which receives as inputs the argument bit $B_n$ and the data bit $\overline{A}_n$ and generates an output on line 71 to AND gate 72. The second input to AND gate 72 is the mask bit $M_n$. The output of AND gate 72 is supplied on line 73, which corresponds to line 62 of FIG. 2, indicating that the argument bit B is "greater than or equal to" the data bit $A_n$ for the selected cell.

The logic cell, as illustrated in FIG. 3, also includes AND gate 74 which receives as inputs the argument bit $B_n$ and the data bit $\overline{A}_n$ and generates an output on line 75. The output on line 75 is supplied to AND gate 76. The second input of AND gate 76 is the mask bit $M_n$. The output of AND gate 76 is supplied on line 77 as a signal corresponding to the signal on line 62 of FIG. 2, indicating that the argument bit $B_n$ is "greater than" the data bit $A_n$.

Alternative logic cell designs could be used which indicate "less than" and "less than or equal to". Of course, effectively these relationships provide the same information as "greater than or equal to" and "greater than", respectively.

Figure 4:
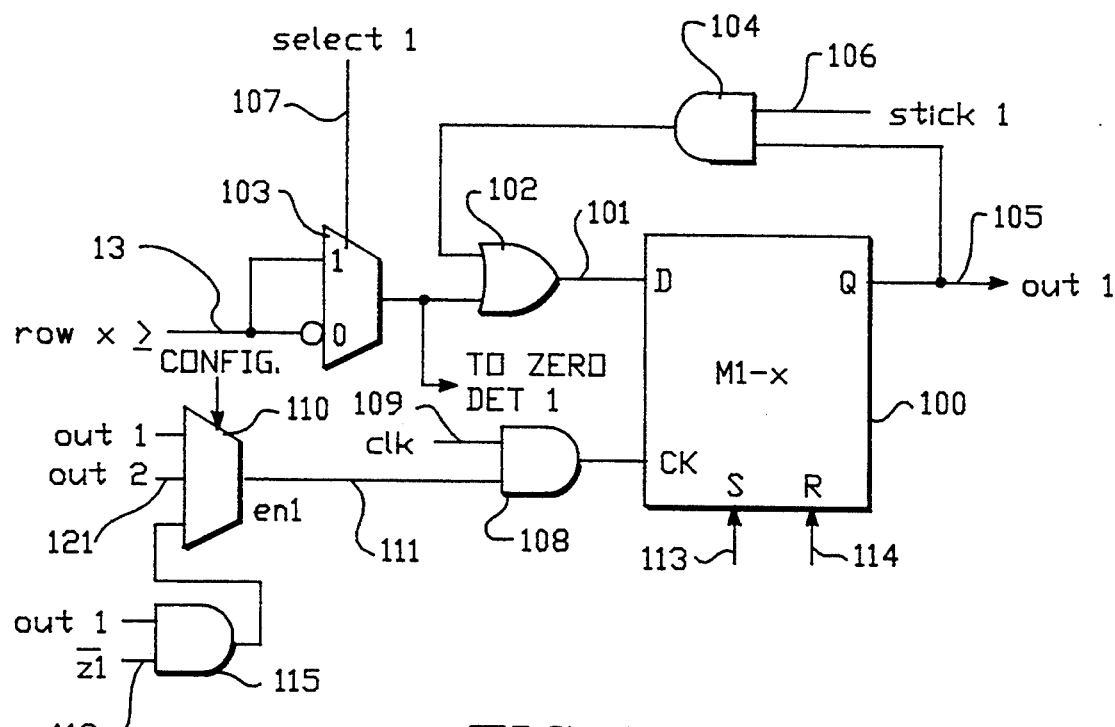
FIG. 4 illustrates a portion of the user configurable control circuit for the system of FIG. 1.
Figure 5:
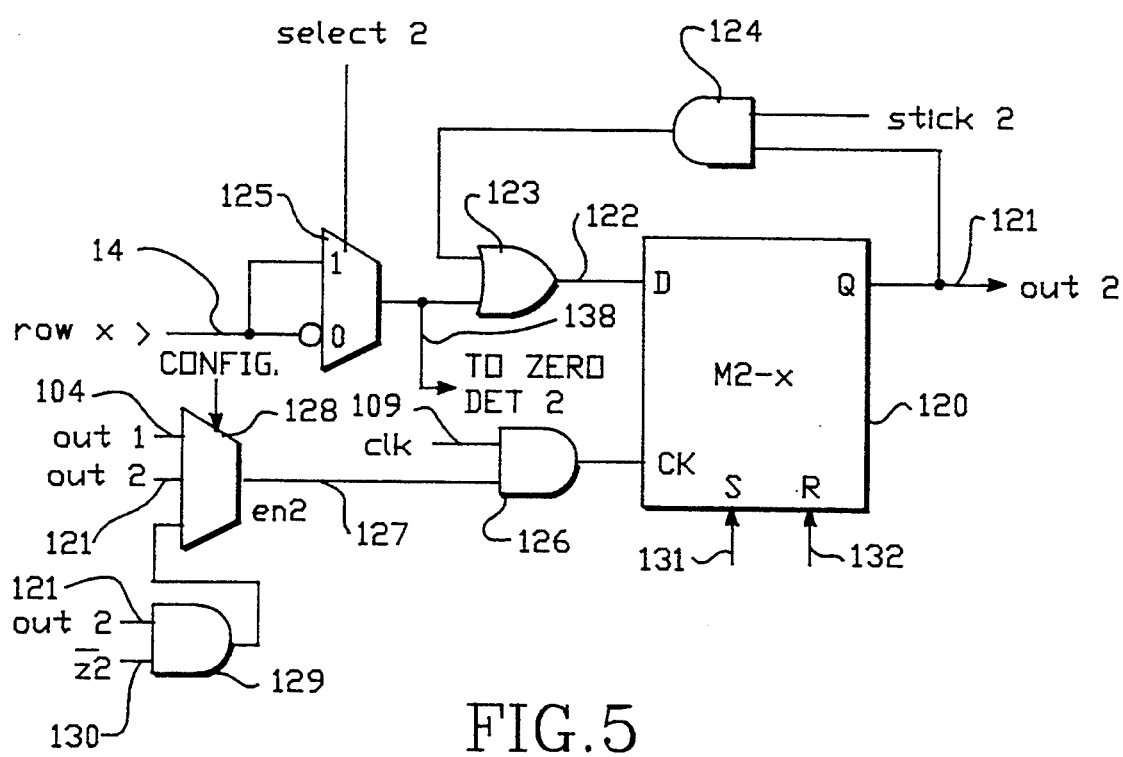
FIG. 5 illustrates another portion of the user configurable control circuit for the system of FIG. 1.

FIG. 4 shows the output circuit M1 for row X and FIG. 5 shows the output circuit M2 for row X. The output circuit M1 is based on register 100. The input to register 100 is the signal on line 101 generated at the output of OR gate 102. The primary input to OR gate 102 is the output of multiplexer 103. The inputs to multiplexer 103 include the B "greater than or equal to" A signal from line 13 of FIG. 1 on select input 1, and the complement which indicates that B is "less than" A, on select input 0.

The second input to OR gate 102 is the output of AND gate 104. The inputs to AND gate 104 include the output of register 100 on line 105, and a configuration signal referred to as "stick1" on line 106.

The selector 103 is controlled by the configuration signal referred to as "select1" on line 107. The output on line 118 of selector 103 is also supplied to zero detect circuitry for the signal $\overline{Z1}$.

The register 100 for row X is clocked at the output of AND gate 108. The inputs to AND gate 108 include the access cycle clock 109, and the output of selector 110 across line 111. The signal on line 111 is referred to as the enable signal en1. The inputs to multiplexer 110 include the output out1 from line 105 of register 100, and the output out2 from output cell M2 shown in FIG. 5. In addition, the third input to selector 110 is the output of AND gate 115. Inputs to AND gate 115 include the out1 signal from line 105 of FIG. 4, and the output of zero detector $\overline{Z1}$ on line 112.

Figure 7:
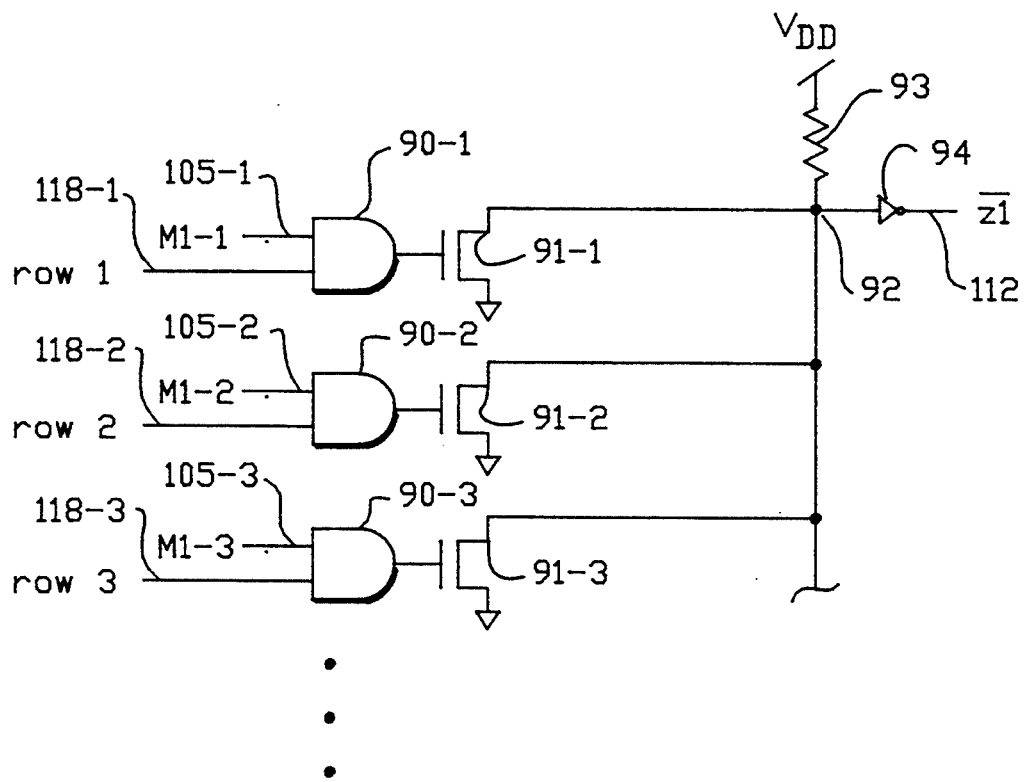
FIG. 7 is a schematic diagram of a zero detect logic used in the detection of the minimum and maximum.

The zero detector may be implemented as shown in FIG. 7, and detects whether the output on line 118 of selector 103 for a given row, ANDed with the output out1 of register 100 for the given row is equal to zero for all rows in the array. If not, the signal $\overline{Z1}$ is asserted high, enabling the output of AND gate 115 to be controlled by the signal out1 on line 105.

The selector 110 is controlled by a configuration input described below with respect to FIG. 8.

The register 100 also includes set and reset inputs on lines 113 and 114, respectively, which are used during initialization of a sort operation in response to the configuration input.

FIG. 5 illustrates the output circuit M2 for row X. As can be seen, it has identical structure to the circuit of FIG. 4, except that the configuration inputs are independent and the input to the structure is the signal on line 14 indicating that the argument bit B is "greater than" the data bit A for the unmasked cell in the row X. Thus, the M2 circuit in FIG. 5 includes register 120 which generates the out2 signal on line 121, and receives as input the signal on line 122 at the output of OR gate 123. The inputs to OR gate 123 include the output of AND gate 124 which is driven by the "stick2" control signal and the output out2 on line 21.

The other input to OR gate 123 is the output on line 138 of selector 125 which is controlled by the configuration input "select2". The inputs to the selector 125 include the signal on line 14 indicating that the argument bit B is "greater than" the data bit A, and the complement thereof which indicates that the argument bit B is "less than or equal to" the data bit A. The output on line 138 is also supplied to zero detect circuitry for the signal $\overline{Z2}$.

The register 120 is clocked at the output of AND gate 126. The inputs to AND gate 126 include the access cycle clock 109, and the output on line 127 of selector 128. The signal on line 127 is referred to as the enable signal en2. The inputs to selector 128 include the OUT1 signal from line 105 of FIG. 4, the out2 signal from line 121, and the output of AND gate 129. The inputs to AND gate 129 include the out2 signal from line 121 and the output of zero detector $\overline{Z2}$ on line 130. The zero detector, again, is implemented as illustrated in FIG. 7 for the M2 array, indicating that the output on line 138 of selector 125, as ANDed with the output out2, is zero for all rows in the array. If not, then the signal $\overline{Z2}$ is asserted high, enabling the output of AND gate 129 to be controlled by the OUT2 signal on line 121.

The selector 128 is also controlled by the configuration input. Similarly, the register 120 includes set input and reset input on lines 131 and 132, respectively used during initialization.

Figure 6:
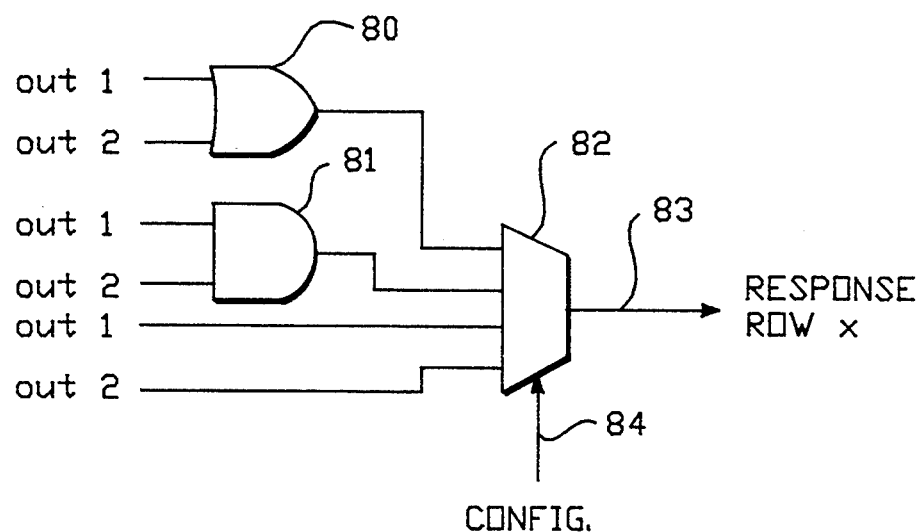
FIG. 6 is a response output circuit for use with the control circuit of FIGS. 4 and 5.

FIG. 6 illustrates the structure of the response output circuit for row X corresponding to element 15 of FIG. 1. This circuit includes OR gate 80 which receives as outputs the out1 and out2 signals from lines 105 and 121, respectively, of FIGS. 4 and 5. In addition, an AND gate 81 is included which receives the out1 and out2 signals as inputs. The outputs of the OR gate 80 and AND gate 81 are coupled to an output selector 82. Additional inputs to the output selector 82 include the out1 and out2 signals. The response for row X is supplied on line 83 at the output of selector 82 in response to a configuration input on line 84.

As mentioned above, the zero detector which generates a signal $\overline{Z1}$ is illustrated in FIG. 7. An identical structure is used for the signal $\overline{Z2}$, except that the inputs are changed to correspond to the M2 circuitry.

For the $\overline{Z1}$ signal, the structure is shown in FIG. 7. The inputs to the zero detect circuit shown in FIG. 7 include the signal on line 118 for a given row. Thus, the signal 118-1 for row 1 is supplied as input, the signal 118-2 for row 2 is supplied as input, and the signal 118-3 for row 3 is supplied as input. There will be one input for each row in the array to be subject of sorting.

Other inputs to the zero detector include the outputs of M1 from the registers 100 for a given row. Thus, the output of M1 for row 1 is supplied on line 105-1, the output of M1 for row 2 is supplied on line 105-2, and the output of M1-3 is supplied on line 105-3.

The signals 105-1 and 118-1 are supplied as inputs to AND gate 90-1. The signals 105-2 and 118-2 are supplied as inputs to AND gate 90-2. The signals 105-3 and 118-3 are supplied as inputs to AND gate 90-3. The outputs of the AND gates 90-1 and 90-3 are supplied to the gates of respective transistors 91-1 through 91-3. The source of such transistors is coupled to ground and the drain of such transistors is coupled to node 92. A resistor 93 is coupled from node 92 to a supply voltage VDD. The signal on node 92 is supplied through inverter 94 to supply the $\overline{Z1}$ signal on line 112.

In operation, if any one of the outputs of AND gates 90-1 through 90-3 is high, the corresponding transistor 91-1 through 91-3 will pull node 92 down, causing the signal $\overline{Z1}$ to be high. If all outputs of AND gates 90-1 through 90-3 are low, then all of the transistors 91-1 through 91-3 will be off, and node 92 will be pulled up through resistor 93. This causes the signal $\overline{Z1}$ on line 112 to be low and disable clocking of the register M1 when the enable signal en1 is configured to be responsive to this zero detect signal.

FIG. 8 illustrates the configurability of the M1 and M2 structures, in response to the configuration input to select any one of seven different relationships for sorting in a given sorting cycle. In a table, the symbol X indicates a don't care situation. For the min of A and the max of A, the arguments are all ones and all zeroes, respectively.

FIG. 8 illustrates the variety of configurations possible with the structure described above with respect to FIGS. 1-7. The configuration input controls the set and reset inputs on the M1 and M2 registers to initialize the registers as shown in the columns labelled M1 INIT and M2 INIT. The select1, stick1, select2, and stick2 signals are set as shown in the columns so labelled. The enable selector for the signal en1 is configured to select the signal as input indicated in the column labelled en1, and the enable selector for the signal en2 is configured to select as output the signal indicated in the column labelled en2. The response output circuit is configured to select as output the combination indicated in the column labelled output.

Simplified examples of the operations involved in detecting each of the seven relationships shown in FIG. 8 are provided in FIGS. 8 A through 8D. FIG. 8 A illustrates the operations used to detect B "greater than or equal to" A, and B "greater than" A. FIG. 8B illustrates the sequence for detection of B "less than" A, and B "less than or equal to" A, FIG. 8C illustrates the sequence for detecting B "equal to" A, and FIG. 8D illustrates the sequences used for detecting the maximum of A and the minimum of A.

FIGS. 8 A through 8C use an example with an argument equal to 1010, and three rows of 4 bit data fields, including 1100 in row 1, 1010 in row 2, and 1001 in row 3. The mask logic is used to select a single column of bits in each cycle of the operation. Thus, in cycle 1, the mask selects the most significant bits for each row and the argument. In cycle 2, the next significant bit is selected. In cycle 3, the third significant bit is selected. In cycle 4, the least significant bit is selected for each of the rows.

In order to detect either B "greater than or equal to" A or B "greater than" A, M1 is initialized as 1 and M2 is initialized as 0. In the first cycle, for example, shown in FIG. 8, select1 is set to select $B_0$ "greater than or equal to" $A_0$ and select2 is set to select $B_0$ "greater than" $A_0$. Thus, M1 for each of the rows in the first cycle will be one and M2 for each of the rows in the first cycle will be 0. In a second cycle, M1 for the first row is 0, because $B_1$ is "less than" $A_1$, but M1 is one for the other two rows. M2 remains 0 for all the rows.

In cycle 3, because the enable bit is configured to be responsive to out1, M1 remains 0 because it is disabled as indicated by the superscript "D". M2 for row 1 is similarly disabled, as indicated in the figure.

In cycle 3, M1 remains 1 for both of rows 2 and 3. M2 for row 2 is 0 and M2 for row 1 is 1. In the fourth cycle, M1 in row 1 remains 0 because it remains disabled. M1 for the second row remains 1, and M1 for the third row becomes 0. M2 for the first row is disabled, as mentioned above, so it remains 0. M2 for the second row remains 0. M2 for the third row remains 1 because of the configuration to stick, as indicated by the superscript "S".

Thus, after four cycles, rows for which B is "greater than or equal to" A are indicated by M1 OR M2. As can be seen in FIG. 8 A, rows 2 and 3 satisfy the relation B "greater than or equal to" A.

Rows that satisfy the relation B "greater than" A are indicated by the output M2. Thus, as indicated in FIG. 8 A, row 3 is the only row satisfying the relation B "greater than" A.

FIG. 8B illustrates the operation to tech B "less than" A and B "less than or equal to" A. The same argument and data fields are used. M1 is initialized to 0 and M2 is initialized to 1. Select1 is set to select the input $B_n$ "less than" $A_n$ and Select2 is set to select the input $B_n$ "less than or equal to" $A_n$. Because the enable bits are set to be responsive to out2, we will discuss M2 first and then M1. In the first cycle, M2 remains 1 for each row. M1 is 0. In the second cycle, M2 remains 1 for each row. M1 is 1 for the first row and 0 for the second two rows. In the third cycle, M2 is 0 for the first row, 1 for the second row, and 0 for the third row. M1 for the first row sticks because of the stick configuration. M1 for rows 2 and 3 remain 0. In the fourth cycle, M2 for the first row remains 0 because it is disabled. Row 1 remains 1 and row 3 remains 0 because they are disabled. M1 for the first row sticks at 1 and is disabled. M1 for the second row remains 0. M1 for the third row remains 0 because it is disabled.

Thus, the rows which satisfy the relation B "less than" A are determined by the value M1. Only row 1 satisfied B "less than" A. Rows which satisfy the relation B "less than or equal to" A as indicated by M1 OR M2 include rows 1 and 2.

FIG. 8C illustrates the operation to detect rows that satisfy the relation B "equal to" A. In this operation, M1 is initialized at 1 and M2 is initialized at 1. Select1 is set to select the input B "greater than or equal to" A and select2 is set to select the input B "less than or equal to" A. In the first cycle, M1 and M2 for all rows are 1. In the second cycle, M1 is zero for the first row and 1 for rows 2 and 3. M2 is 1 for all rows. In the third cycle, M1 for row 1 is disabled and remains at 0. M1 for rows 2 and 3 remains 1. M2 for the third cycle becomes 0 in the first row, 1 in the second row and 0 in the third row.

In the fourth cycle, M1 for the first row remains disabled at 0. M1 for the second row remains 1. M1 for the third row becomes 0. M2 for the first row remains 0 because it is disabled. M2 for the second row remains 1. M2 for the third row remains 0 because it is disabled.

The set of rows which satisfy the relation B "equal to" A as indicated by M1 and M2, includes only row 2.

FIG. 8D illustrates the operations for detecting the maximum of A and the minimum of A. To detect the maximum of A, the argument is set at all zeroes. M1 is initialized at 1 and the select1 is configured to select B "less than" A. In the first cycle, M1 remains 1 for all rows. In the second cycle, M1 becomes 1 for row 1 and 0 for rows 2 and 3. In the third cycle, M1 remains 1 because of the zero detect output $\overline{Z1}$ disables clocking of the register as indicated by the superscript "ZD". M1 for rows 2 and 3 remains 0 because they are disabled, as indicated by the superscript "D".

In cycle 4, M1 for row 1 remains 1 because of the zero detect output, M1 for row 2 remains 0 because it is disabled, and row 3 remains 0 because it is disabled. Thus, the maximum over A as indicated by the output M1, is stored in row 1.

The minimum, as shown in FIG. 8D, is detected using M2. The argument is set to all ones and M2 is initialized to 1. In the first cycle, M2 remains 1 in all rows because the zero detect output. In the second cycle, M2 becomes 0 in row 1 and remains 1 in rows 2 and 3. In the third cycle, M2 for row 1 remains 0 because it is disabled, M2 becomes 0 in row 2, and M2 remains 1 in row 3. In the fourth cycle, M2 remains 0 in the first row, 0 in the second row, and 1 in the third row because of the zero detect output. Thus, the minimum over A, as indicated by the value M2, is found in row 3.

Figure 9:
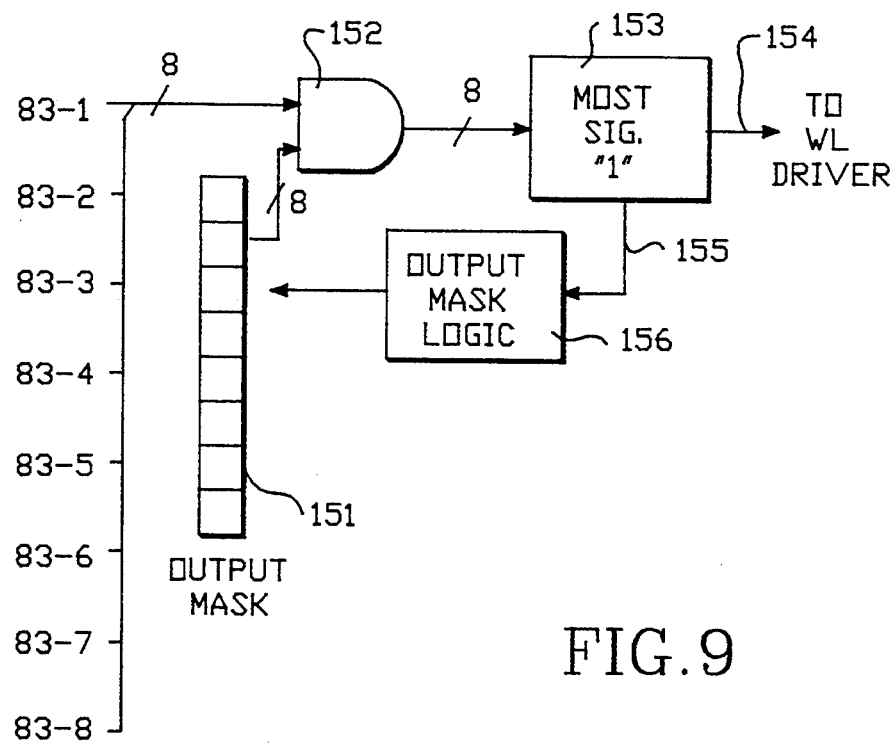
FIG. 9 is a schematic diagram of an access control circuit for use in the control logic of FIG. 1.
Figure 10:
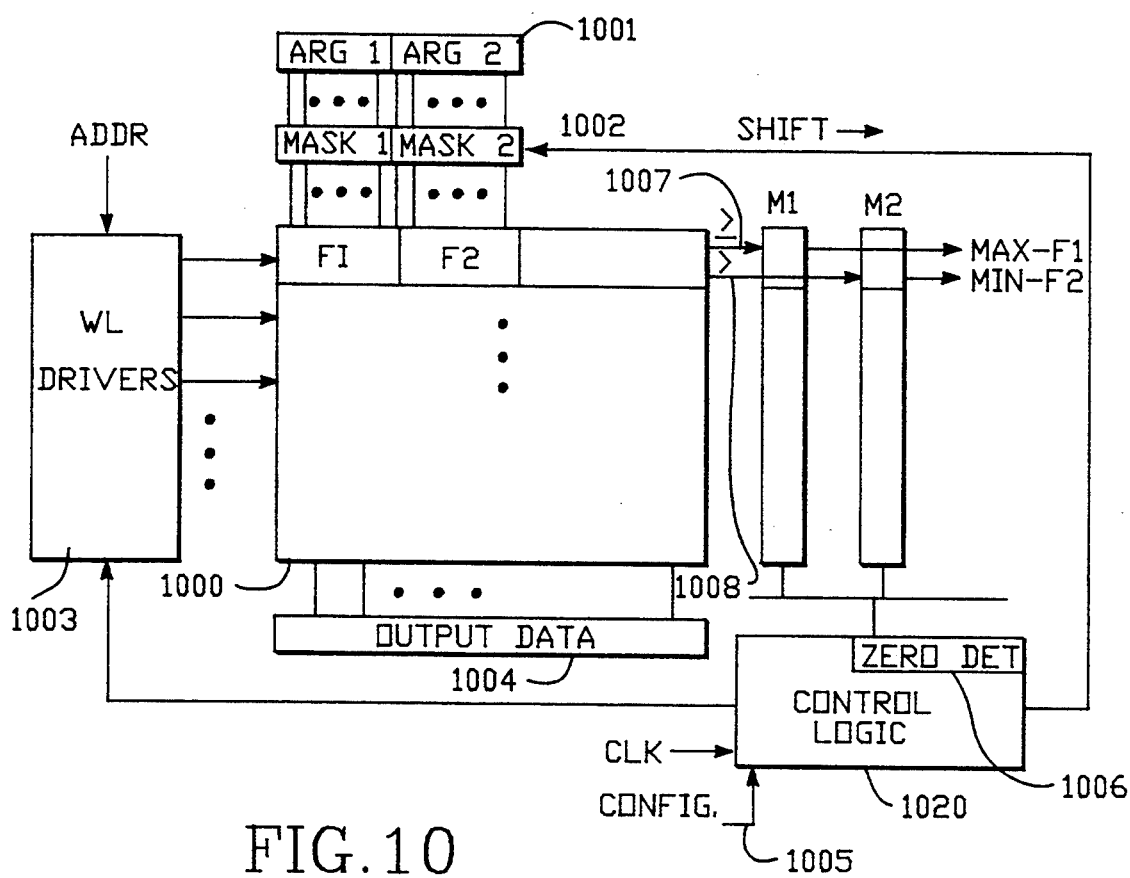
FIG. 10 is a schematic block diagram of an alternative system for detecting the maximum and minimum in parallel on two separate fields within the memory.

FIG. 9 illustrates access control circuitry in control logic 20 for use in the circuit of FIG. 1. For simplicity, FIG. 4 shows an access control circuit for a memory array 10 having eight rows. Obviously, systems with many more rows may be implemented. According to the embodiment shown in FIG. 4, the response outputs from corresponding rows for each of the eight rows are supplied on lines 83-1 through 83-8. A mask register 151 storing eight bits is included in the access control logic 20. The response outputs on lines 83-1 through 83-8 are ANDed in bitwise fashion with the outputs of the mask register 151 in an AND array 152. The eight outputs of AND array 152 are supplied to a "most significant 1" detector 153. The output of the "most significant 1" detector 153 is supplied on line 154, which corresponds to line 25 of FIG. 1. Line 154 indicates to the word line drivers a particular row for output in the data out register 26 in the current access cycle. Also, the "most significant 1" detector 153 generates a signal on line 155 for controlling output mask logic 156. The output mask logic 156 and the output mask 151 are operable to supply the set of rows of data indicated by the response output stored in registers M1 and M2 in sequence. Thus, after the most significant 1 is supplied, the output mask logic 156 updates the output mask to disable selection of the most significant 1 and any bits higher in significance in the next cycle. Thus, in the next cycle, the next most significant row is identified by logic 153. This sequence continues until all the rows in the set are outputted in a sequence of cycles.

For example, Table 1 illustrates operation of the output mask logic for a particular output, in which the rows of storage elements are assigned an order indicated in column 1. The second column in Table 1 illustrates an example result of a sorting operation in which the data stored in rows 7, 5, 4, and 3 satisfy the configured relationship. In this instance, the output mask logic will be controlled in the first cycle as shown in the third column of the Table, so that all mask bits are set, resulting in energizing the word line for row 7. In the second cycle, in the fourth column of the Table, the mask is set so that rows 7 and 8 are masked to detect the next most significant bit satisfying the relationships, and row 5 is outputted. Similarly, in the third cycle, the mask register is updated so that rows 5, 6, 7, and 8 are masked and row 4 is outputted. In the fourth cycle shown in the sixth column of the Table, the mask is updated so that rows 4, 5, 6, 7, and 8 are masked and the word line for the third row is energized. In the fifth cycle, the mask is updated so that rows 3–8 are masked. Since rows 2 and 1 do not satisfy the relationships, no word line is energized, and the algorithm is done.

TABLE 1

| ROW | M1.M2 | CYCLE 1 MASK/WL | CYCLE 2 MASK/WL | CYCLE 3 MASK/WL |
|---|---|---|---|---|
| 8 | 0 | 1/0 | 0/0 | 0/0 |
| 7 | 1 | 1/1 | 0/0 | 0/0 |
| 6 | 0 | 1/0 | 1/0 | 0/0 |
| 5 | 1 | 1/0 | 1/1 | 0/0 |
| 4 | 1 | 1/0 | 1/0 | 1/1 |
| 3 | 1 | 1/0 | 1/0 | 1/0 |
| 2 | 0 | 1/0 | 1/0 | 1/0 |
| 1 | 0 | 1/0 | 1/0 | 1/0 |

| ROW | M1.M2 | CYCLE 4 MASK/WL | CYCLE 5 MASK/WL |
|---|---|---|---|
| 8 | 0 | 0/0 | 0/0 |
| 7 | 1 | 0/0 | 0/0 |
| 6 | 0 | 0/0 | 0/0 |
| 5 | 1 | 0/0 | 0/0 |
| 4 | 1 | 0/0 | 0/0 |
| 3 | 1 | 1/1 | 0/0 |
| 2 | 0 | 1/0 | 1/0 |
| 1 | 0 | 1/0 | 1/0 |

Obviously, a wide variety of round robin polling techniques, priority techniques, or other techniques for selecting a particular row in response to the access cycle could be used.

The configurations which detect the maximum and minimum have the characteristic that they rely on a single output circuit M1 or M2, respectively. Thus, unique memory array taking advantage of that characteristic can be designed to detect the maximum of a first field and the minimum of a second field in parallel. FIG. 10 illustrates the implementation of such a circuit. The system includes a memory array implemented as described above with respect to FIG. 1. Each row in the array includes a first field F1 and a second field F2. The argument data in argument register 1001 includes a first argument ARG1 and a second argument ARG2 which map to corresponding fields F1 and F2 in the corresponding row. Similarly, the mask register 1002 includes a first mask MASK1 and a second mask MASK2 for the corresponding fields F1 and F2.

The argument register 1001 may be replaced by hardwired values of all zeroes for field F1 used to detect the maximum, and all ones for field F2 used to detect the minimum. Alternatively, the argument field may be programmable to limit the range of the max and min operations.

As described in FIG. 1, the system includes word line drivers 1003 and an output data register 1004 for supplying data in response to the access control logic included in the control logic block 1004. Control logic block may or may not include a configuration input 1005. The control logic block 1004 also includes zero detect circuitry 1005 for each M1 and M2 arrays as described above.

The output on line 1007 for a given row indicates whether the argument bit 0 is "greater than or equal to" the data bit. The output on line 1008 indicates whether the argument bit 1 is "greater than" the data bit. These values may be altered to detect merely the state of the data bit as 1 or 0, with the output logic modified as necessary.

As mentioned above, the M2 circuitry is configured to select the inverse of the signal on line 1007 as input which indicates whether the argument bit is "less than" the data bit. Similarly, the circuitry M2 is configured on the table of FIG. 8 to select as input the signal on line 1008 indicating whether the argument bit is "greater than" the data bit.

For the embodiment shown in FIG. 10, the signal on line 1007 may be connected only to those storage elements in field F1, and the signal line 1008 may be connected only to those storage elements included in field F2. To find the rows storing the maximum value of F1 and the rows storing the maximum value of F2 in parallel, the mask register is implemented to select one bit from field F1 and one bit from field F2 in each cycle. Thus, for a 4 bit field F1 and a 4 bit field F2, the set of rows satisfying the maximum and minimum for F1 and F2, respectively, can be detected in four cycles. More generally, for a field F1 having N bits and a field F2 having M bits, the rows satisfying the maximum of F1 and minimum of F2 can be sorted in a number of cycles equal to the maximum of M and N.

A configurable associative memory, according to present mention, can also be implemented using a standard associative memory array which detects the relationship of equality between the argument and data. For this type of memory array, the logic cell 52, coupled with the memory, includes an exclusive OR gate which detects the equality relationship between the argument bit and the data bit, and an AND gate which provides mask logic. The control circuit for implementing a configurable associative memory, according to the present invention, using the equality output is illustrated in FIG. 11. Thus, the equality output from a line in the memory array is supplied on line 200. This signal is supplied as a first input to a flip-flop 201. The output of the flip-flop 201 is supplied on line 202 as the out1 signal.

The flip-flop 201 is clocked by the output of AND gate 203. The inputs to AND gate 203 include the clock signal CK, and the out1 signal on line 202.

The signal on line 200 is also supplied to active low inputs of AND gates 204 and 205. The argument bit $ARG_n$ for the unmasked bit in the line is supplied on line 206 to an active low input of gate 204 and to an active high input of gate 205.

The outputs of the AND gates 204 and 205 are supplied to a selector 207. The selector 207 is controlled by the S1 signal to supply an output on line 208. The signal on line 208 is supplied as input to flip-flop 209. The output of flip-flop 209 is supplied on line 210 as the out2 signal. Flip-flop 209 is clocked at the output of AND gate 211. The inputs to AND gate 211 include the clock signal CK, and the output of selector 212. Selector 212 is controlled by the S2 signal to select the out1 signal on line 202, or the output of AND gate 213. The inputs to AND gate 213 include a zero detect signal on line 214, and the out2 signal on line 210.

The zero detect signal is generated by a circuit such as that described with reference to FIG. 7, where the signals on lines 118-1 through 118-3 correspond to line 208 for a given row.

FIG. 12 illustrates the response output circuit for use with the control circuit of FIG. 11. This circuit consists of a selector 220 controlled by the controlled by the signal S3. The inputs to the selector 220 include the out1 signal line 202, the out2 signal on line 210, and the output of an OR gate 221. The inputs to the OR gate 221 include the out1 signal on line 202 and the out2 signal on line 210. Thus, a response output is supplied on line 222, according to a particular relationship indicated by the S3 signal supplied by a configuration input.

The configuration input in the embodiment of FIG. 11 controls the initialization of the flip-flops 201 and 209 through their respective INIT inputs. Also, the configuration input controls the signals S1, S2 and S3 to control the output of selectors 207, 212 and 220, respectively.

FIG. 13 is a table indicating the effect of the configuration input for each of the plurality of relationships, for which the circuit of FIG. 11 can be configured. In the table, the X is a don't care.

For the relationship B=A, the out2 INIT value, S2 value and S3 may be modified as indicated in the parentheses for an optimized version. According to the optimized version, the selector 220 may be simplified to a 2 input selector, selecting between the inputs 1 and 2, if the out2 register 209 is initialized as zero, the S2 selector is set to select input 1, and the output of selector 220 is set to select the input 2.

The embodiment described with respect to FIGS. 11 through 13 may be preferred in many applications of the present invention, because of the much simplified cell in the associative memory array. However, this system suffers the disadvantage that it may not be configured to detect the minimum and the maximum of separate fields in parallel as described above with reference to FIG. 10.

In conclusion, unique associative memory architectures have been provided which are configurable by the user to accomplish any one of a plurality of relationships as suits the needs of a particular application. Further, the memory operates very quickly relative to prior art techniques for accomplishing these results.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A configurable relationship discovery system for discovering the truth or falsity of a configuration-defined one of plural relationships between a configuration-defined argument field of a supplied argument signal and a plurality of J configuration-defined data fields within a corresponding plurality of J data words, where the supplied argument signal has a plurality of N argument bits and each data word in the plurality of J data words has a corresponding plurality of N data bits, said system comprising:

(a) memory means for storing the plurality of J data words, said stored plurality of a data words defining a J-by-N array of data bits;

(b) a J-by-N array of plural logic means arranged at least conceptually as J rows and N columns, said J-by-N array of plural logic means being operatively coupled to the memory means and responsive to the supplied argument signal, each of the logic means being for outputting a respective first plurality of indicator signals indicating a true or false state for at least two unique relationships that may exist between a corresponding one of the N argument bits and a corresponding one of the J-by-N data bits; and (c) a configurable plurality of J output means, operatively coupled to the J-by-N array of plural logic means and responsive to supplied configuration data, each configurable output means being for collecting sequentially over time the respective first plurality of indicator signals from a corresponding row of logic means and deriving from said collection a respective second plurality of indicator signals, where the respective second plurality of indicator signals indicates in accordance with the supplied configuration data, true or false states for a corresponding plurality of configuration-defined relationships between a configuration-defined field of the supplied argument signal and a corresponding, configuration-defined field of the respective data word.

2. A configurable relationship discovery system according to claim 1 wherein:

each of said configurable plurality of output means is individually configurable to derive from the collected and corresponding first plurality indicator signals, the corresponding second plurality of indicator signals;

each corresponding second plurality of indicator signals contains information for determining the truth or falsity of at least two unique relationships selected from the group consisting of: (1) argument field 'greater than or equal to' data field; (2) argument field 'greater than' data field; (3) argument field 'less than or equal to' data field: (4) argument field 'less than' data field; and (5) argument field 'equal to' data field; and said system further includes:

(d) a plurality of J output combining means each being responsive to the supplied configuration data, and each being for receiving the corresponding second plurality of indicator signals and deriving therefrom a response signal indicating the truth or falsity of a configuration-defined one of said group of unique relationships.

3. A configurable relationship discovery system according to claim 1 further comprising:

(d) mask means, responsive to the supplied configuration data, for sequentially unmasking one or more bits of the argument signal and unmasking a corresponding one or more bits of each of the J data words in accordance with the supplied configuration data;

wherein said J-by-N array Of plural logic means is responsive to the mask means such that each logic means outputs as its corresponding first plurality of indicator signals, signals indicating at least two unique relationships between a corresponding unmasked argument bit and a corresponding unmasked data bit; and wherein each said configurable output means is operatively coupled to the corresponding row of logic means and responsive to said configuration data so as to collect the corresponding first plurality of indicator signals for unmasked bits of the argument signal and for unmasked bits of the corresponding data word and so as derive from the collected first plurality of indicator signals, in accordance with the succession of unmaskings, said corresponding second plurality of indicator signals.

4. A configurable relationship discovery system for discovering the truth or falsity of configuration-defined ones of plural relationships between a configuration-defined argument field of a supplied argument signal and a plurality of J configuration-defined data fields within a corresponding plurality of J data words, where the supplied argument signal has N argument bits and each data word in the plurality of J data words has a corresponding plurality of N data bits, said system comprising:

(a) memory means for storing the plurality of J data words, said stored plurality of data words defining an array of at least J-by-N data bits;

(b) mask means for unmasking one or more bits of the argument signal and unmasking a corresponding one or more bits of each of the data words;

(c) logic cell means, operatively coupled to the memory means and to the mask means and responsive to the supplied argument signal, for outputting a first plurality of indicator signals indicating one or more bitwise relationships between each unmasked argument bit and each correspondingly unmasked data bit;

(d) configurable output cell means, operatively coupled to the logic cell means and responsive to supplied configuration data, for collecting sequentially over time the first plurality of indicator signals and deriving from said collection a respective second plurality of indicator signals, where the respective second plurality of indicator signals indicates in accordance with the supplied configuration data, a true or false state for a corresponding plurality of configuration-defined relationships between a configuration-defined field of the supplied argument signal and corresponding, configuration-defined fields of the plurality of J data words.

5. A configurable data associating apparatus comprising:

(a) data array storing means for storing a plurality of J data words, each stored data word having at least a plurality of N data bits, the N data bits of each of the respective J data words defining at least conceptually a data array of J rows and N columns;

(b) argument receiving means for receiving an argument word having at least a plurality of N argument bits;

(c) comparison means, operatively coupled to the argument receiving means and to the data array storing means, for comparing simultaneously a given argument bit against a corresponding column of J data bits and simultaneously outputting a first plurality of relationship indicating signals, wherein the first plurality of relationship indicating signals has J subsets, each subset corresponding to a respective one of the J data words, and each subset including at least two first relationship indicating signals that indicate at least two unique relationships between the given argument bit and the respective data bit;

(d) column selecting means, coupled to the comparison means, for selecting one of the N columns of the data array and causing the comparison means to simultaneously output the first plurality of relationship indicating signals of the selected column;

(e) a plurality of J sequential-state circuits each configurable in response to supplied configuration data, each of the J sequential-state circuits being coupled to receive over time the correspondingly output subsets of the first plurality of relationship indicating signals of a corresponding data array row and to decide, based on the number and sequential order of selected columns selected by the column selecting means, whether a predefined one or more configuration-defined relationships definitively exists or not between the selected argument bits and selected data bits of the corresponding data array row, (e.1) wherein each sequential-state circuit outputs at least one decision output signal representing its corresponding decision, and (e.2) wherein each sequential-state circuit includes programmable decision stick means, responsive to the supplied configuration data, for storing one or more decision signals representing a corresponding one or more tentative decisions about the existence of the predefined one or more relationships between the selected argument bits and data bits of the corresponding data array row and for selectively blocking alteration of at least one of the stored decision signals in responsive to the state of the same or another of the stored decision signals and in further response to the supplied configuration data.

6. A data associating apparatus according to claim 5 wherein the supplied configuration data includes a stick-enabling signal and said decision stick means comprises:

(e.2a) flip flop means having a D-input and a Q-output, said flip flop means being for receiving data at the D-input, storing the received data, and outputting stored data at the Q-output;

(e.2b) logic OR means having first and second inputs and an output coupled to the D-input of the flip flop means, the first input of the logic OR means being coupled to receive a first OR input signal derived from a corresponding one of said relationship indicating signals;

(e.2c) logic AND means having first and second inputs and an output coupled to the second input of the logic OR means, the first input of the logic AND means being coupled to the Q-output of the flip flop means, the second input of the logic AND means being coupled to receive the stick-enabling signal.

7. A data associating apparatus according to claim 6 wherein the supplied configuration data includes a select signal and said decision stick means further comprises:

(e.2d) selection means, responsive to the select signal and coupled to the first input of the logic OR means, for selectively deriving from the corresponding one of said relationship indicating signals the first OR input signal.

8. A data associating apparatus according to claim 5 wherein the supplied configuration data includes a configuration signal and said decision stick means comprises:

(e.2a) clocked flip flop means having a D-input, a clock input and a Q-output, said flip flop means being for receiving data at the D-input, receiving a gated clock signal at the clock input, storing the received data in synchronism with the gated clock signal, and outputting stored data at the Q-output;

(e.2b) logic AND means having first and second inputs and an output coupled to the clock input of the flip flop means, the first input of the logic AND means being coupled to receive a pre-gate clock signal; and (e.2c) multiplexer means responsive to the configuration signal and having a plurality of inputs and further having an output coupled to the second input of the logic AND means, said multiplexer means being for routing a signal on a selected one of the plural multiplexer inputs to the multiplexer output, wherein at least one of the multiplexer inputs is coupled to the Q-output of the flip flop means.

9. A data associating apparatus according to claim 5 wherein the at least two unique relationships include 'greater than' and 'greater than or equal to'.

10. A data associating apparatus according to claim 5 wherein the programmable decision stick means of each of the J sequential-state circuits has no more than two memory means for storing the one or more decision signals.

11. A data associating apparatus according to claim 5 wherein each sequential-state circuit decides, based on the number and sequential order of selected columns selected by the column selecting means, whether each of at least two unique relationships definitively exists or not between the selected argument bits and selected data bits of the corresponding row;

wherein each sequential-state circuit outputs at least two decision output signals representing its corresponding, unique decisions; and wherein the data associating apparatus further comprises:

(f) a plurality of J combining circuits, each coupled to receive a corresponding set of at least two decision output signals from a corresponding one of the J sequential-state circuits, each combining circuit being responsive to the supplied configuration data for outputting a response signal representing a selected one or a selected logical combination of the corresponding set of at least two decision output signals.

12. A data associating apparatus according to claim 11 wherein each combining circuit comprises:

(f.1) logical ORring means for producing a first combined decision signal representing a logical OR of the corresponding set of at least two decision output signals;

(f.2) logical ANDing means for producing a second combined decision signal representing a logical AND of the corresponding set of at least two decision output signals; and (f.3) combination selecting means, coupled to receive the corresponding set of at least two decision output signals and the first combined decision signal and the second combined decision signal, for outputting as said response signal a configuration-defined one of the corresponding set of at least two decision output signals and the first combined decision signal and the second combined decision signal.

13. A configurable data associating apparatus comprising:

(a) data array storing means for storing a plurality of J data words, each stored data word having at least a plurality of N data bits, the N data bits of each of the respective J data words defining at least conceptually a data array of J rows and N columns;

(b) argument receiving means for receiving an argument word having at least a plurality of N argument bits;

(c) comparison means, operatively coupled to the argument receiving means and to the data array storing means, for comparing simultaneously a given argument bit against a corresponding column of J data bits and simultaneously outputting a first plurality of relationship indicating signals, wherein the first plurality of relationship indicating signals has J subsets, each subset corresponding to a respective one of the J data words, and each subset including at least two first relationship indicating signals that indicate at least two different relationships between the given argument bit and the respective data bit;

(d) column selecting means, coupled to the comparison means, for selecting one of the N columns of the data array and causing the comparison means to simultaneously output the first plurality of relationship indicating signals of the selected column;

(e) a plurality of J sequential-state circuits each configurable in response to supplied configuration data, each of the J sequential-state circuits being coupled to receive over time the correspondingly output subsets of the first plurality of relationship indicating signals of a corresponding data array row and to decide, based on the number and sequential order of selected columns selected by the column selecting means, whether a predefined one or more configuration-defined relationships definitively exists or not between the selected argument bits and selected data bits of the corresponding data array row, (e.1) wherein each sequential-state circuit has a first node for outputting a first in time decision signal representing a corresponding current decision, and (e.2) wherein each sequential-state circuit has a second node for receiving a second in time decision signal representing a corresponding second in time decision that may replace the corresponding current decision; and (f) detector means, coupled to the first and second nodes of each of the plurality of J sequential-state circuits, for detecting a condition wherein each of the plurality of J sequential-state circuits has reached or is going to next in time reach a same predefined decision state and for outputting a condition detect signal representative of the truth or falsity of said condition.

14. A data associating apparatus according to claim 13 wherein each of the J sequential-state circuits is configurable so as to be selectively responsive or not responsive to the condition detect signal.

15. A data associating apparatus according to claim 13 wherein each of the J sequential-state circuits is responsive to the condition detect signal.

16. A data associating apparatus according to claim 15 wherein:

(b.1) said argument receiving means includes argument register means for storing the argument word, said argument register means being settable or resettable to respectively store bits all set to logic one or all reset to logic zero; and the data associating apparatus further comprises:

(g) control logic means for locating maximum or minimum ones of the J data words by respectively setting or resetting the argument register means to store bits all set to logic one or all reset to logic zero and using the detector means to detect the condition wherein the sequential-state circuits of the respective maximum or minimum ones of the J data words are last in time among the J sequential-state circuits to switch from one decision state to another.

17. A configurable data associating apparatus comprising:

(a) data array storing means for storing a plurality of J data words, each stored data word having at least a plurality of N data bits, the N data bits of each of the respective J data words defining at least conceptually a data array of J rows and N columns;

(b) argument receiving means for receiving an argument word having at least a plurality of N argument bits;

(c) comparison means, operatively coupled to the argument receiving means and to the data array storing means, for comparing simultaneously a given argument bit against a corresponding column of J data bits and simultaneously outputting a first plurality of relationship indicating signals, wherein the first plurality of relationship indicating signals has J subsets, each subset corresponding to a respective one of the J data words, and each subset including at least two first relationship indicating signals that indicate at least two different relationships between the given argument bit and the respective data bit;

(d) column selecting means, coupled to the comparison means, for selecting one of the N columns of the data array and causing the comparison means to simultaneously output the first plurality of relationship indicating signals of the selected column;

(e) a plurality of J sequential-state circuits each configurable in response to supplied configuration data, each of the J sequential-state circuits being coupled to receive over time the correspondingly output subsets of the first plurality of relationship indicating signals of a corresponding data array row and to decide, based on the number and sequential order of selected columns selected by the column selecting means, whether a plurality of configuration-defined relationships definitively exist or not between the selected argument bits and selected data bits of the corresponding data array row, each sequential-state circuit having a plurality of output nodes for generating plural decision output signals representing said decision about the plurality of configuration-defined relationships;

(f) a plurality of J combining circuits, each coupled to receive a corresponding set of plural decision output signals from a corresponding one of the J sequential-state circuits, each combining circuit being responsive to the supplied configuration data for outputting a response signal representing a selected one or a selected logical combination of the corresponding set of plural decision output signals; and (g) data word addressing means, operatively coupled to the plurality of J combining circuits and to the data array storing means, for detecting one or more of the J data words satisfying the configuration-defined relationship and for outputting addresses corresponding to the relationship satisfying data words to an address receiving portion of the data array storing means.

18. A data associating apparatus according to claim 17 wherein said data word addressing means includes:

(g.1) prioritizing means for prioritizing among those of the J data words satisfying the configuration-defined relationship; and (g.2) sequencing means for sequentially outputting said addresses in accordance with the priority established by the prioritizing means.

19. A configurable data associating apparatus comprising:

(a) data array storing means for storing a plurality of J data words, each stored data word having at least a plurality of N data bits, the N data bits of each of the respective J data words defining at least conceptually a data array of J rows and N columns, each stored data word further being divided into at least first and second data fields;

(b) argument receiving means for receiving an argument word having at least a plurality of N argument bits, said argument word being divided into at least first and second argument fields;

(c) comparison means, operatively coupled to the argument receiving means and to the data array storing means, for comparing simultaneously a given argument bit in the first argument field against a corresponding column of J data bits in the first data field, for comparing simultaneously a given argument bit in the second argument field against a corresponding column of J data bits in the second data field, and simultaneously outputting respective first and second pluralities of relationship indicating signals, wherein the first plurality of relationship indicating signals has J subsets, each subset corresponding to a respective one of the J data words, and each subset including a first relationship indicating signal that indicates a first relationship between the given argument bit of the first argument field and the respective data bit in the first data field;

wherein the second plurality of relationship indicating signals has J subsets, each subset corresponding to a respective one of the J data words, and each subset including a second relationship indicating signal that indicates a second relationship between the given argument bit of the second argument field and the respective data bit in the second data field, said second relationship being different than said first relationship;

(d) column selecting means, coupled to the comparison means, for selecting a respective one of the N columns of the data array for each of the first and second data fields and causing the comparison means to simultaneously output the first and second pluralities of relationship indicating signals of the respectively selected columns;

(e) a plurality of J sequential-state circuits each configurable in response to supplied configuration data, each of the J sequential-state circuits being coupled to receive over time the correspondingly output subsets of the first and second pluralities of relationship indicating signals of a corresponding data array row and to decide, based on the number and sequential order of selected columns selected by the column selecting means, whether a predefined plurality of configuration-defined relationships definitively exists or not between the selected argument bits and selected data bits of the corresponding fields in the data array row.

20. A data associating apparatus according to claim 19 further comprising:
(f) control means for configuring the plurality of J sequential-state circuits to output respective response signals identifying those of the J data words having respective first and second data fields satisfying the plurality of configuration-defined relationships.

21. A data associating apparatus according to claim 20 wherein the plurality of configuration-defined relationships includes at least one of the given data word being a maximum or minimum of the J data words for the corresponding data field.

22. A configurable data associating apparatus comprising:
(a) data array storing means for storing a plurality of J data words, each stored data word having at least a plurality of N data bits, the N data bits of each of the respective J data words defining at least conceptually a data array of J rows and N columns;
(b) argument receiving means for receiving an argument word having at least a plurality of N argument bits;
(c) first comparison means, operatively coupled to the argument receiving means and to the data array storing means, for comparing simultaneously a given argument bit against a corresponding column of J data bits and simultaneously outputting a first plurality of relationship indicating signals indicating equality or mismatch between the given argument bit and each of the J data bits of the corresponding column;
(d) second comparison means, operatively coupled to the argument receiving means and to the first comparison means, for comparing simultaneously a given argument bit against a corresponding column of J data bits and simultaneously outputting a second plurality of relationship indicating signals indicating a 'greater than' or 'less than' condition being true between the given argument bit and each of the J data bits of the corresponding column;
(e) column selecting means, coupled to the first and second comparison means, for selecting one of the N columns of the data array and causing the first and second comparison means to simultaneously output the first and second pluralities of relationship indicating signals for the selected column;
(f) a plurality of J sequential-state circuits each configurable in response to supplied configuration data, the J sequential-state circuits being coupled to receive over time the correspondingly output first and second pluralities of relationship indicating signals of a corresponding data array row and to decide, based on the number and sequential order of selected columns selected by the column selecting means, whether a predefined one or more configuration-defined relationships definitively exists or not between the selected argument bits and selected data bits of the corresponding data array row.

* * * * *